(12) United States Patent
Cramer et al.

(10) Patent No.: US 12,328,131 B2
(45) Date of Patent: Jun. 10, 2025

(54) AIRFLOW ARRANGEMENT IN A WIRELESS AUDIO TRANSCEIVER HOUSING

(71) Applicant: Shure Acquisition Holdings, Inc., Niles, IL (US)

(72) Inventors: Jacob Cramer, Chicago, IL (US); Henry Villegas, Phoenix, AZ (US)

(73) Assignee: Shure Acquisition Holdings, Inc., Niles, IL (US)

( * ) Notice: Subject to any disclaimer, the term of this patent is extended or adjusted under 35 U.S.C. 154(b) by 423 days.

(21) Appl. No.: 17/937,662

(22) Filed: Oct. 3, 2022

(65) Prior Publication Data

US 2023/0108011 A1 Apr. 6, 2023

Related U.S. Application Data

(60) Provisional application No. 63/251,946, filed on Oct. 4, 2021.

(51) Int. Cl.
*H04B 1/036* (2006.01)
*H04B 1/08* (2006.01)
*H05K 7/20* (2006.01)

(52) U.S. Cl.
CPC .............. *H04B 1/036* (2013.01); *H04B 1/08* (2013.01); *H05K 7/20145* (2013.01)

(58) Field of Classification Search
CPC ........... H05K 7/20909; H05K 7/20145; H05K 7/20563; G06F 1/203; G06F 1/183; G06F 1/20; H01L 23/467; F25B 41/20; F25B 2600/2507; F25B 2313/0233; F25B 2313/0272; F25B 2313/0314; F25B 2313/0315; F25B 2500/19; F25B 2700/1931; F25B 2700/21163; F25B 2700/21174; F25B 49/005; F25B 13/00;
(Continued)

(56) References Cited

U.S. PATENT DOCUMENTS 5,287,244 A 2/1994 Hileman et al.
6,288,897 B1 9/2001 Fritschle
(Continued)

FOREIGN PATENT DOCUMENTS

CN 101674715 B 6/2013
CN 203504949 U 3/2014
(Continued)

OTHER PUBLICATIONS

TX1000 V3 FM Transmitter, BW Broadcast, <https://www.bwbroadcast.com/fm-transmitters/tx1000-v3-fm-transmitter/75/product> visited on Oct. 3, 2022.
(Continued)

*Primary Examiner* — Cindy Trandai
(74) *Attorney, Agent, or Firm* — Banner & Witcoff, Ltd.

(57) ABSTRACT

An wireless audio transceiver housing comprising an air inlet, an intake manifold, one or more fans, directing vanes, and an exhaust port, wherein the geometry of the intake manifold, the directing vanes, and the exhaust port are configured to enhance airflow from the one or more fans through the housing, over a heatsink, and out the exhaust port towards the rear of the housing by minimizing the pressure drop for the one or more fans and maximizing the potential for airflow through the unit.

21 Claims, 9 Drawing Sheets

(58) Field of Classification Search
CPC ....... F24F 11/38; F24F 2140/20; H04B 1/036; H04B 1/08
See application file for complete search history.

(56) References Cited

U.S. PATENT DOCUMENTS

| | | | |
|---|---|---|---|
| 6,862,182 | B1 | 3/2005 | Roman et al. |
| 7,430,117 | B2 | 9/2008 | Shabany |
| 7,719,836 | B2 | 5/2010 | Franz et al. |
| 7,764,493 | B2* | 7/2010 | Ali ............... H01L 23/4093 |
| | | | 361/679.48 |
| 8,175,757 | B2 | 5/2012 | Aggus et al. |
| 8,356,656 | B2 | 1/2013 | Chang et al. |
| 8,544,289 | B2 | 10/2013 | Johnson et al. |
| 8,625,279 | B2* | 1/2014 | Hata ............... G06F 1/203 |
| | | | 361/679.48 |
| 9,301,435 | B2 | 3/2016 | Kang |
| 9,788,461 | B2 | 10/2017 | Van Gaal |
| 10,178,814 | B2 | 1/2019 | Falk et al. |
| 10,462,938 | B2 | 10/2019 | Wan et al. |
| 2008/0137296 | A1 | 6/2008 | DuQuette |
| 2009/0135561 | A1 | 5/2009 | Chang |
| 2012/0033379 | A1* | 2/2012 | Lam ............... H05K 7/20572 |
| | | | 361/695 |
| 2012/0044630 | A1 | 2/2012 | Elwany |
| 2018/0191183 | A1* | 7/2018 | Namiki ............... H05K 7/20145 |
| 2019/0124795 | A1* | 4/2019 | Dayal ............... H05K 7/20736 |
| 2020/0396861 | A1 | 12/2020 | Baldwin, Jr. et al. |
| 2021/0173456 | A1* | 6/2021 | Kulkarni ............... H05K 7/20163 |
| 2021/0373624 | A1* | 12/2021 | Schnell ............... H05K 7/20136 |

FOREIGN PATENT DOCUMENTS

| | | |
|---|---|---|
| CN | 205902236 U | 1/2017 |
| CN | 210721285 U | 6/2020 |
| CN | 211321690 U | 8/2020 |

OTHER PUBLICATIONS

NEW—1.1 Kw DSTL 1k FM Telecomponents Transmitter, Telecomponents Broad Cast, <http://www.telecomponents.com/catalog/1-kw-new-fm-stereo-transmitters-11-kw-dstl1k-p-623.html> visited on Oct. 3, 2022.
Jan. 1, 20232 - (WO) International Search Report and Written Opinion - App PCT/US2022/077450.

* cited by examiner

AIRFLOW ARRANGEMENT IN A WIRELESS AUDIO TRANSCEIVER HOUSING

CROSS-REFERENCE TO RELATED APPLICATION

This application claims priority to U.S. Provisional Patent Application No. 63/251,946, filed on Oct. 4, 2021, which is hereby incorporated by reference in its entirety.

FIELD

The present disclosure relates generally to heat management in an electronics housing, and more particularly to a low-pressure cooling system providing high airflow in a transceiver housing.

BACKGROUND

Wireless audio systems are commonly used for live-sound applications. Wireless audio systems often include receivers, transmitters, and transceivers. Transceivers are electronic devices that can both transmit and receive audio signals. In some instances, transceivers can receive multiple channels of audio signals and transmit the multiple channels of audio signals to performers and other devices in the wireless audio system. Transceivers that can receive and transmit multiple channels of audio signals are often contained in a housing or a chassis. In some instances, the housing may be rack-mountable in a one rack unit (RU) space. A rack unit is a unit of measure describing a measurement of the height of a rack frame and the height of the equipment that may be mounted in the housing. One RU equals 1.75 inches. As transceiver housings evolve to accommodate additional audio signal channels, offer advanced signal processing capability, faster transmission speeds, etc., within a one RU profile, the heat released by the transceiver components commensurately increases. Adequate airflow must be provided to the housing so that the transceiver components are effectively cooled.

SUMMARY

The following presents a simplified summary of the disclosure in order to provide a basic understanding of some aspects of the disclosure. This summary is not an extensive overview of the disclosure. It is not intended to identify key or critical elements of the disclosure or to delineate the scope of the disclosure. The following summary merely presents some concepts of the disclosure in a simplified form as a prelude to the more detailed description provided below.

The present disclosure solves many of the aforementioned problems by providing an airflow arrangement in a housing that minimizes the pressure drop through the unit and maximizes the potential for airflow through the unit. The airflow arrangement may facilitate a low system pressure to maximize the potential for airflow through the unit. The airflow arrangement may regulate the velocity of airflow through the system to help prevent unwanted noise resulting from the airflow through the system.

An example arrangement may include horizontally offset fans that draw ambient air through an inlet and through an intake manifold. The manifold may be configured with ducting geometry that minimizes the pressure drop into the fans and reduces noise. The fans may supply airflow to a heatsink via directing vanes that direct the cooling airflow through the heatsink and towards an exhaust port. The exhaust port may include a plurality of louvers that direct hot air towards the rear of the housing and help to prevent the hot air from reentering the intake inlet.

These as well as other novel advantages, details, embodiments, features and objects of the present disclosure will be apparent to those skilled in the art from following the detailed description of the disclosure, the attached claims and accompanying drawings, listed herein, which are useful in explaining the disclosure.

BRIEF DESCRIPTION OF THE DRAWINGS

A more complete understanding of the present disclosure and the advantages thereof may be acquired by referring to the following description in consideration of the accompanying drawings, in which like reference numbers indicate like features, and wherein:

FIG. 5b is a cross-sectional view of the example exhaust port of FIG. 5a indicated by line 5a/5b in FIG. 5a.

DETAILED DESCRIPTION

In the following description of the various examples, reference is made to the accompanying drawings, which form a part hereof, and in which is shown by way of illustration various examples in which aspects may be practiced. References to "embodiment," "example," and the like indicate that the embodiment(s) or example(s) of the disclosure so described may include particular features, structures, or characteristics, but not every embodiment or example necessarily includes the particular features, structures, or characteristics. Further, it is contemplated that certain embodiments or examples may have some, all, or none of the features described for other examples. And it is to be understood that other embodiments and examples may be utilized and structural and functional modifications may be made without departing from the scope of the present disclosure.

Unless otherwise specified, the use of the serial adjectives, such as, "first," "second," "third," and the like that are used to describe components, are used only to indicate different components, which can be similar components. But the use of such serial adjectives are not intended to imply that the components must be provided in given order, either temporally, spatially, in ranking, or in any other way.

Also, while the terms "front," "back," "side," and the like may be used in this specification to describe various example features and elements, these terms are used herein as a matter of convenience, for example, based on the example orientations shown in the figures and/or the orientations in typical use. Nothing in this specification should be construed as requiring a specific three dimensional or spatial orientation of structures in order to fall within the scope of the claims.

Figure 1:
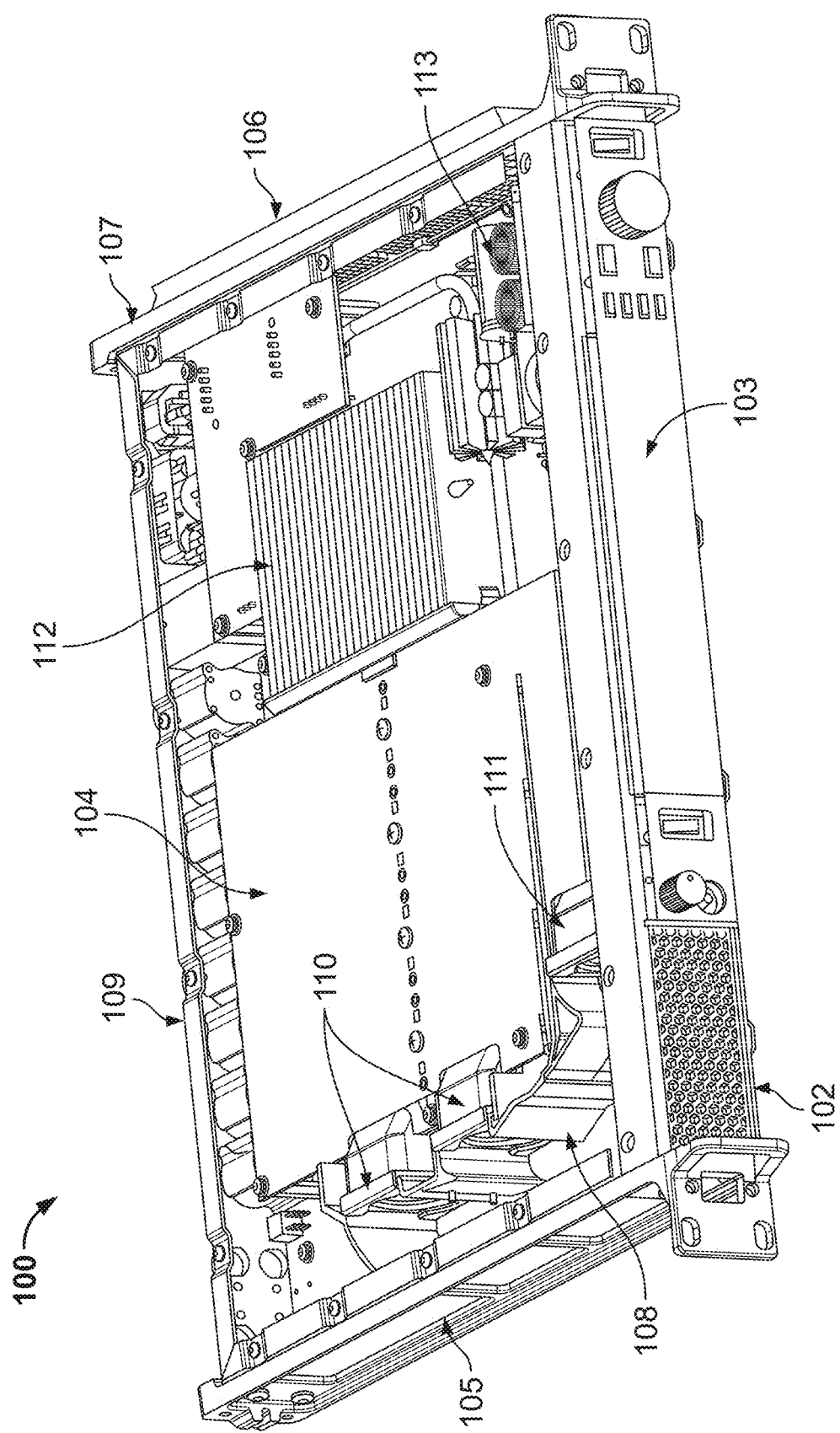
FIG. 1 is a front perspective view of an example airflow arrangement in a transceiver housing.

FIG. 1 illustrates an example housing 100 that may be configured as a cooling system that may provide high flow, low-pressure airflow throughout the housing 100. The housing 100 may include electronics adapted for the receipt and transmission of audio signals, such as a printed circuit board (PCB) 104. PCB 104 may include at least one processor, an analog to digital converter, and several power amplifiers. In one example, PCB 104 may be configured as a Radio Frequency (RF) PCB capable of receiving and/or transmitting communications signals in a number of frequencies. Housing 100 may further include a heatsink 112, AC/DC converter 113, and a plurality of connectors 404 (shown in FIG. 4) and the like. The housing may be fabricated with metal, aluminum, plastics, or any other durable material. The housing 100 may include a front face 103, a rear face 109, sidewalls 105 and 107, and a top (removed). The housing 100 may be rack-mountable and may occupy a one rack unit (RU) space. As will be discussed in further detail below, the housing may include an air inlet 102, intake manifold 108, fans 110 and fan 111, and an exhaust louver 106 all configured to function in concert to provide a high flow of evenly distributed, low-pressure airflow throughout the housing 100 to adequately cool the electronics.

The front face 103 may include ambient air inlet 102. In one example, the air inlet 102 may be disposed within the front face 103 nearer sidewall 105 than sidewall 107. The air inlet 102 may perforated or may include metal mesh, grates, grids, or webbing to prevent foreign objects large enough to cause damage to fans 110 and fan 111 from crossing the threshold of air inlet 102.

The air inlet 102 may be configured as a common air inlet for fans 110 and fan 111. In one example, housing 100 may include two fans 110 and one fan 111 that may increase the airflow through the housing 100. In other examples, housing 100 may include fewer or more fans 110 and/or fan 111. The fans 110 and 111 may be spaced from the front face 103 to the rear face 109 of the housing such that each fan carries a cooling load across different portions of the housing 100. For example, fans 110 may share the cooling load across the PCB 104 and a heatsink 112, while fan 111 may carry a cooling load across, for example, the AC/DC converter 113. Fans 110 and fan 111 may be electrically connected to the processor and a power supply. The processor may be configured to independently enable and/or disable power to each fan 110 and/or fan 111 based on the cooling needs of the housing 100, which may help lower overall power consumption when certain electronics are below a certain temperature and do not require cooling. For example, the processor may enable fan 111 if the AC/DC converter reaches a certain temperature, while disabling fans 110 if the PCB 104 is below a certain temperature. The processor may also independently control the fan speed of fans 110 and fan 111 depending on the cooling needs of the housing 100. The fans 110 and fan 111 may provide airflow sufficient to cool 98 watts in a 1 RU space.

In one example, the intakes (or inlet ducts) of fans 110 and fan 111 may be substantially perpendicular to the air inlet 102. As the fans 110 and fan 111 draw air from the air inlet 102, the direction of the airflow may be redirected as it enters each inlet of fans 110 and fan 111. That is, airflow entering the air inlet 102 may be traveling in one direction, while the airflow entering each inlet of fans 110 and fan 111 may travel in a second direction. In one example, the direction of the airflow entering each inlet of fans 110 and fan 111 may be approximately 90 degrees different than that of the airflow entering the air inlet 102. In order to help ensure balanced distribution of airflow from the air inlet 102, and to minimize the pressure drop through each fan, the fans 110 and fan 111 may be offset at different distances from the sidewall 105. A pressure drop may impair the cooling performance of the system by reducing the overall airflow throughout the housing 100. The fans 110 and fan 111 may be offset from the sidewall 105 to maximize the available airflow from the inlet 102. For example, fan 111 may be offset from the sidewall 105 at a distance further away from the sidewall 105 than that of fans 110. In another example, the forwardmost fan 110 may be offset at a distance from sidewall 105 less than that of fan 111 but more than that of the rearmost fan 110.

The fans 110 and fan 111 may be configured to engage with an intake manifold 108. The intake manifold 108, sidewall 105, and air inlet 102 may define an intake plenum from which fans 110 and fan 111 may draw air. In one example, the intake manifold 108 may be configured with a geometry optimized to deliver evenly distributed airflow from the air inlet 102 to each fan 110 and 111 and may minimize the noise of the airflow entering and exiting each fan. For example, the intake manifold may define curved pathways for the airflow to reach each of the fans 110 and fan 111. These curved pathways may help ensure that the direction of airflow is properly directed into each inlet of fans 110 and fan 111. The curved pathways may also help throttle the velocity of the airflow into the inlets of fans 110 and fan 111. For example, the curved pathways may be configured to prevent an airflow velocity into each fan from exceeding 7 meters per second which may help prevent unwanted noise, such as whistling, humming, loud vibration, and/or tonal noise (i.e., noises that occupy a specific frequency and said frequency's harmonics) resulting from the airflow into each fan. In this example, ensuring that the airflow velocity into the inlet of each fan does not exceed approximately seven meters per second may ensure that the airflow exhibits laminar flow characteristics. The intake manifold may be fabricated with a variety of materials that may be configured to have a smoothness that minimizes air turbulence around the curved pathways to further help prevent unwanted noises such as whistling, humming, such as whistling, humming, loud vibration, and/or tonal noise. In one example, the airflow arrangement may be configured to keep the resultant noise level emanating from the transceiver housing at or below 14 decibels (dB) sound pressure level (SPL) measured at 1 meter from the transceiver housing. In another example, the airflow arrangement may be configured to keep the resultant noise level at or below 9 dB(A) SPL (i.e., A-Weighted, or SPL adjusted to conform to the frequency response of the human ear) measured at 1 meter from the transceiver housing.

Figure 2:
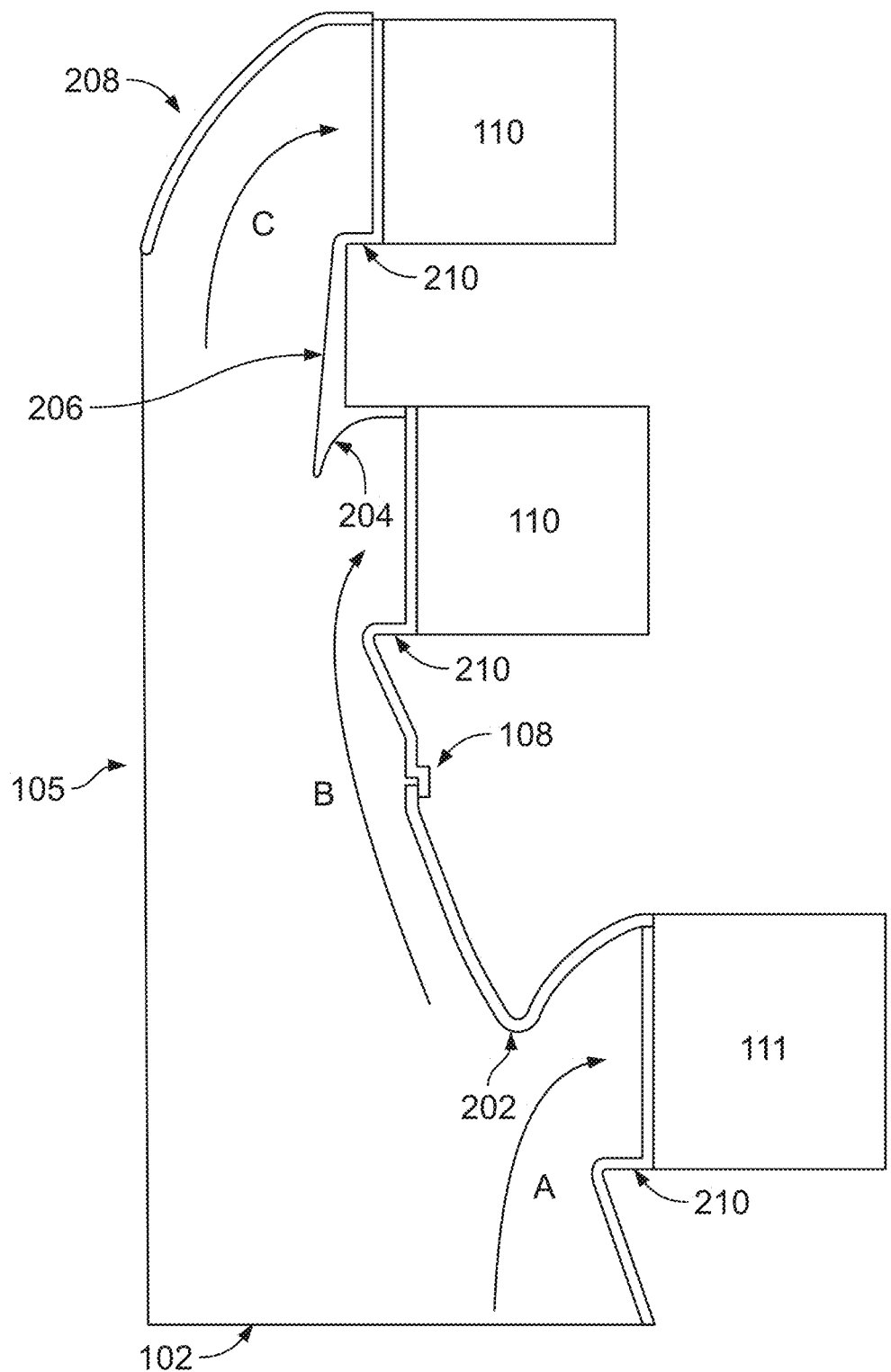
FIG. 2 is a plan view of an example intake manifold arrangement of the transceiver housing airflow arrangement of FIG. 1.

Referring to FIG. 2, the intake manifold 108 may be configured with a geometry that may be optimized to evenly distribute airflow across fan 111 and fans 110 while minimizing and maintaining a consistent low air pressure at the inlets of the fans 110 and fan 111. For example, the intake manifold 108 may be configured to offset the fans 110 and fan 111 from the sidewall 105 such that the fan 111 may be offset a further distance from the sidewall 105 than that of fans 110. The plenum defined by the manifold 108, inlet 102 and sidewall 105 may be at its widest nearest the inlet 102 and may be at its narrowest nearest the rearmost fan 110 to help ensure a consistent air pressure at the inlet of each fan 110 and fan 111 and to help maximize the potential for airflow to fans 110 and fan 111.

The intake manifold 108 may include a curved member 202 that directs airflow from the air inlet 102 into fan 111 (illustrated by arrow "A") while directing the remainder of the airflow towards fans 110. In one example, the curved member 202 may turn the air approximately 90 degrees into the inlet of fan 111. In other examples, the curved member 202 may be configured to bend the airflow more or less than 90 degrees into the inlet of fan 111. As airflow makes its way rearward towards the fans 110, the geometry of the intake manifold 108 may be configured such that the distance between the sidewall 105 and fans 110 gradually decreases, which may help to maintain a consistent low air pressure within the plenum and may help to optimize airflow into each fan. The intake manifold 108 may include a curved partition 204 that may direct airflow from the air inlet 102 and the sheared airflow from curve 202 into the topmost fan 110 (illustrated by arrow "B"). In one example, the curved partition 204 may bend the air approximately 90 degrees into the forwardmost fan 110. In another example, the curved partition 204 may bend the air more or less than 90 degrees into the forwardmost fan 110. The intake manifold 108 may include an angled member 206 and a curved member 208 near the rear of the housing 100 that may direct the remainder of the airflow from air inlet 102 to the inlet of the rearmost fan 110 (illustrated by arrow "C"). In one example, the curved member 208 may turn the air approximately 90 degrees into the rearmost fan 110. In another example, the curved member 208 may turn the air more or less than 90 degrees into the rearmost fan 110.

The intake manifold may include protruding members 210 at the bottom of each fan inlet. The protruding members may help regulate the velocity of the airflow into fans 110 and fan 111 and may operate in concert with curved members 202, 204, and 208 to regulate the velocity of the airflow represented by arrows "A," "B," and "C," and to redirect said airflows approximately 90 degrees from the air inlet 102 into fans 110 and fan 111. In some instances, the airflow may cause unwanted noise if the airflow velocity is too high into fans 110 and fan 111. The geometry of the protruding members may help ensure that the airflow velocity does not reach a value that causes unwanted noise such as whistling, humming, loud vibration, and/or tonal noise. For example, the airflow velocity may be reduced as the airflow indicated by arrows "A"–"C" encounters protruding members 210 and is forced to travel around those members. In one example, the geometry of the protruding members 210 may help ensure that the airflow velocity is at or below approximately 7 meters per second and maintains laminar flow characteristics.

Figure 3A:
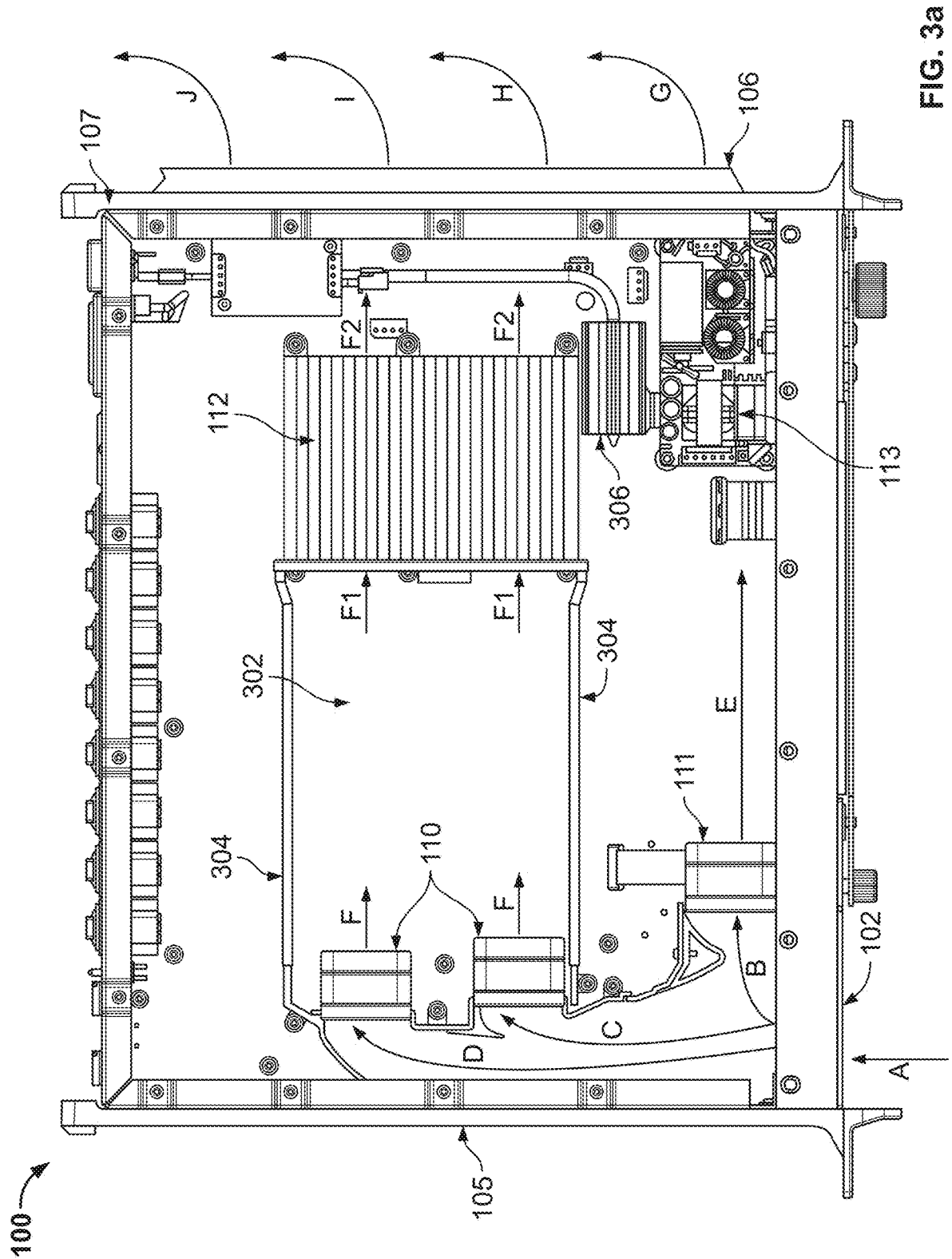
FIG. 3a is a plan view of the example airflow arrangement of FIG. 1.

FIG. 3a illustrates the airflow path throughout the housing 100. As discussed in greater detail with respect to FIG. 2, ambient air may be drawn into the inlet 102 by fans 110 and fan 111 (as shown by arrow "A"). The intake manifold 108 may be configured to regulate airflow across fan 111 and fans 110 by minimizing pressure drop across each fan and throttling the velocity of the airflow as it passes through each fan (as shown by arrows "B"—"D").

In one example, the airflow entering inlet 102, fans 110, and fan 111 (as shown by arrows "A"—"D") may be characterized as a laminar flow. That is, the airflow columns represented by arrows "A"-"D" might not laterally mix to create turbulence at the inlet 102 and the inlets of fans 110 and fan 111. Turbulence may cause drag, which may consequently increase the air pressure at the fan inlets. Increased air pressure may cause unwanted noise resulting from the turbulent flow. Increased air pressure may also cause unwanted noise that may be characterized as tonal noise. The unwanted noise, humming, loud vibration, and/or tonal noise may comprise a frequency or frequencies between the range of 1500-4000 Hz.

As described above, a processor may control the fan speed of fans 110 and fan 111 depending on the cooling needs of the housing 100. The fans 110 and fan 111 may operate at various and independent capacities (or duty cycles) based on, for example, the temperature in the housing 100. Table 1 below shows several example duty cycles and corresponding fan speeds measured in RPM:

TABLE 1

| | Measured Fan Speed (RPM) | | |
| --- | --- | --- | --- |
| Duty Cycle | Fan 111 | Bottommost Fan 110 | Topmost Fan 110 |
| 100% | 8816 | 9208 | 7801 |
| 72% | 6763 | 6757 | 6790 |
| 50% | 4704 | 4700 | 4700 |
| 37% | 3477 | 3484 | 3469 |

Accordingly, the fans 110 and fan 111 may produce variable flow rates of air at various points in housing 100. The airflow characteristics through various portions of housing 100 may therefore correspond to the capacity at which fans 110 and fan 111 are operating. The flow rates of air may produce a resultant, unwanted, noise in the transceiver housing, as is described herein. Table 2 below shows several example duty cycles and corresponding noise levels (both raw dB SPL and dB(A), or A-Weighted, SPL) measured at a 1-meter distance from the transceiver housing:

TABLE 2

| | Raw dB SPL | dB(A) SPL |
| --- | --- | --- |
| Noise Floor | 12.881 | 5.01 |
| 100% Duty Cycle | 13.449 | 8.79 |
| 72% Duty Cycle | 12.024 | 6.32 |
| 50% Duty Cycle | 12.73 | 5.65 |
| 37% Duty Cycle | 11.3 | 5.25 |

In one example, when the fans 110 and 111 produce a flow rate of around 32.8 m$^3$/hr of air through the threshold of the inlet vent 102, the airflow represented by arrow "A" may provide a Reynolds number of about 10031. In another example, when the fans provide roughly 32.8 m$^3$/hr of flow at the inlet of the vent 102, the airflow represented by arrow "A" may provide a Reynolds number of between about 9028 to 11034. When fans 110 and fan 111 provide roughly 15.9 m$^3$/hr of flow through the threshold of the inlet of vent 102, the airflow entering the threshold of inlet vent 102 may provide a Reynolds number of between about 4369 to about 5340. When fans 110 and fan 111 provide roughly 9.1 m$^3$/hr of flow through the threshold of the inlet of vent 102, the airflow entering the threshold of inlet vent 102 may provide a Reynolds number of between about 2514 and about 3072.

In one example, the airflow represented by arrow "B" may provide a Reynolds number of about 7390 at the threshold of the inlet of fan 111 when fan 111 is providing roughly 11.1 m$^3$/hr of flow through the threshold of the inlet of fan 111. In another example, the airflow represented by arrow "B" may provide a Reynolds number of between about 6651 to about 8129 at the threshold of the inlet of fan 111 when fan 111 is providing roughly 11.1 m$^3$/hr of flow through the threshold of the inlet of fan 111. When fan 111 is providing roughly 5.4 m³/hr of flow through the threshold of the inlet of fan 111, the airflow entering the inlet of fan 111 may provide a Reynolds number of about 3278 to about 4006. When fan 111 is providing roughly 3.2 m³/hr of flow through the threshold of the inlet of fan 111, the airflow entering the inlet of fan 111 may provide a Reynolds number of between about 1926 and about 2354.

In one example, the airflow represented by arrow "C" may provide a Reynolds number of about 7150 at the inlet of the bottommost fan 110 (i.e., fan 110 nearest to inlet vent 102) when bottommost fan 110 is providing roughly 10.7 m³/hr of flow through the threshold of the inlet of bottommost fan 110. In another example, the airflow represented by arrow "C" may provide a Reynolds number of between about 6435 to about 7865 at the inlet of the bottommost fan 110 when the bottommost fan 110 is providing roughly 10.7 m³/hr of flow through the threshold of the inlet of bottommost fan 110. When bottommost fan 110 is providing roughly 5.2 m³/hr of flow through the threshold of the inlet of bottommost fan 110, the airflow entering the inlet of bottommost fan 110 may provide a Reynolds number of about 3094 to about 3782. When bottommost fan 110 is providing roughly 2.9 m³/hr of flow through the threshold of the inlet of bottommost fan 110, the airflow entering the inlet of bottommost fan 110 may provide a Reynolds number of between about 1766 and about 2158.

In one example, the airflow represented by arrow "D" may provide a Reynolds number of about 7288 at the threshold of the inlet of the topmost fan 110 (i.e., the fan 110 furthest away from inlet vent 102) when topmost fan 110 is providing roughly 10.9 m³/hr of flow through the threshold of the inlet of topmost fan 110. In another example, the airflow represented by arrow "D" may provide a Reynolds number of between about 6559 to about 8017 at the inlet of the topmost fan 110 when topmost fan 110 is providing roughly 10.9 m³/hr of flow through the threshold of the inlet of topmost fan 110. When fan 110 is providing roughly 5.2 m³/hr of flow through the threshold of the inlet of topmost fan 110, the airflow entering the inlet of topmost fan 110 may provide a Reynolds number of about 3135 to about 3832. When fan 110 is providing roughly 3 m³/hr of flow through the threshold of the inlet of topmost fan 110, the airflow entering the inlet of topmost fan 110 may provide a Reynolds number of between about 1779 and about 2174.

In some examples, when fans 110 and fan 111 are providing maximum flow rate of air through the housing 100, the maximum pressure drop (total pressure) across the inlet vent 102 and fan 111 may be about 3.3 pascals (Pa); the maximum pressure drop across the inlet vent 102 and the bottommost fan 110 may be about 4.2 Pa; the maximum pressure drop across the inlet vent 102 and the topmost fan 110 may be about 3.9 Pa. When fans 110 and fan 111 provide maximum flow rate of air through the housing, the maximum velocity of airflow throughout housing 100 may be about 7.02 meters per second (m/s) or less.

Fans 110 may supply airflow to the heat sink 112 through a duct 302 (shown by arrows "F"). The duct 302 may have an upper surface that is substantially planar. The upper surface may be defined by PCB 104 (shown in FIG. 1). In one example, an additional PCB (not shown) may be disposed beneath the PCB 104 and may define the lower surface of the duct 302. In another example, the bottom of the housing 100 may define the lower surface of the duct 302. The duct 302 may have sides that are defined by vanes 304. Vanes 304 may be adjacent to the fans 110. Vanes 304 may extend upwards to the PCB 104 and may extend from the intake manifold 108 to the heatsink 112 such that the duct 302 may be substantially enclosed. The vanes 304 may be integrally molded with the intake manifold 108. Alternatively, the vanes 304 may be configured to engage with the manifold 108 and the frame of the heatsink 112.

In one example, fan 111 may carry a cooling load across a secondary heatsink 306 and an AC/DC converter 113 (illustrated by arrow "E"), which may help dissipate warm air radiating from the heatsink 306 and may help ensure that the AC/DC converter 113 is adequately cooled. As mentioned, in one example fans 110 may supply airflow to the heatsink 112, which may help dissipate warm air radiating from the heatsink 112 (as shown by arrows "G").

Figure 3B:
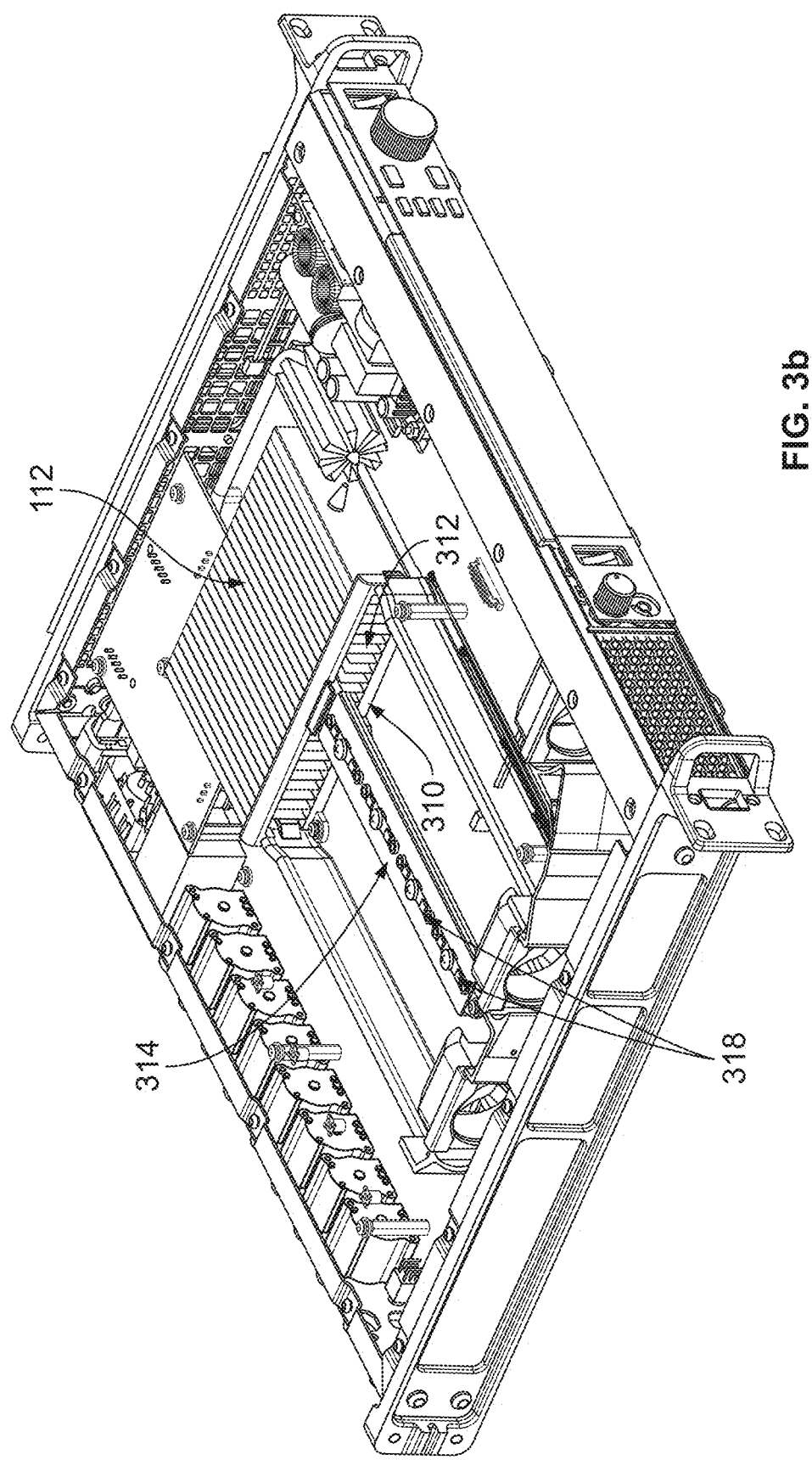
FIG. 3b is a perspective view of the example airflow arrangement of FIG. 1.
Figure 3C:
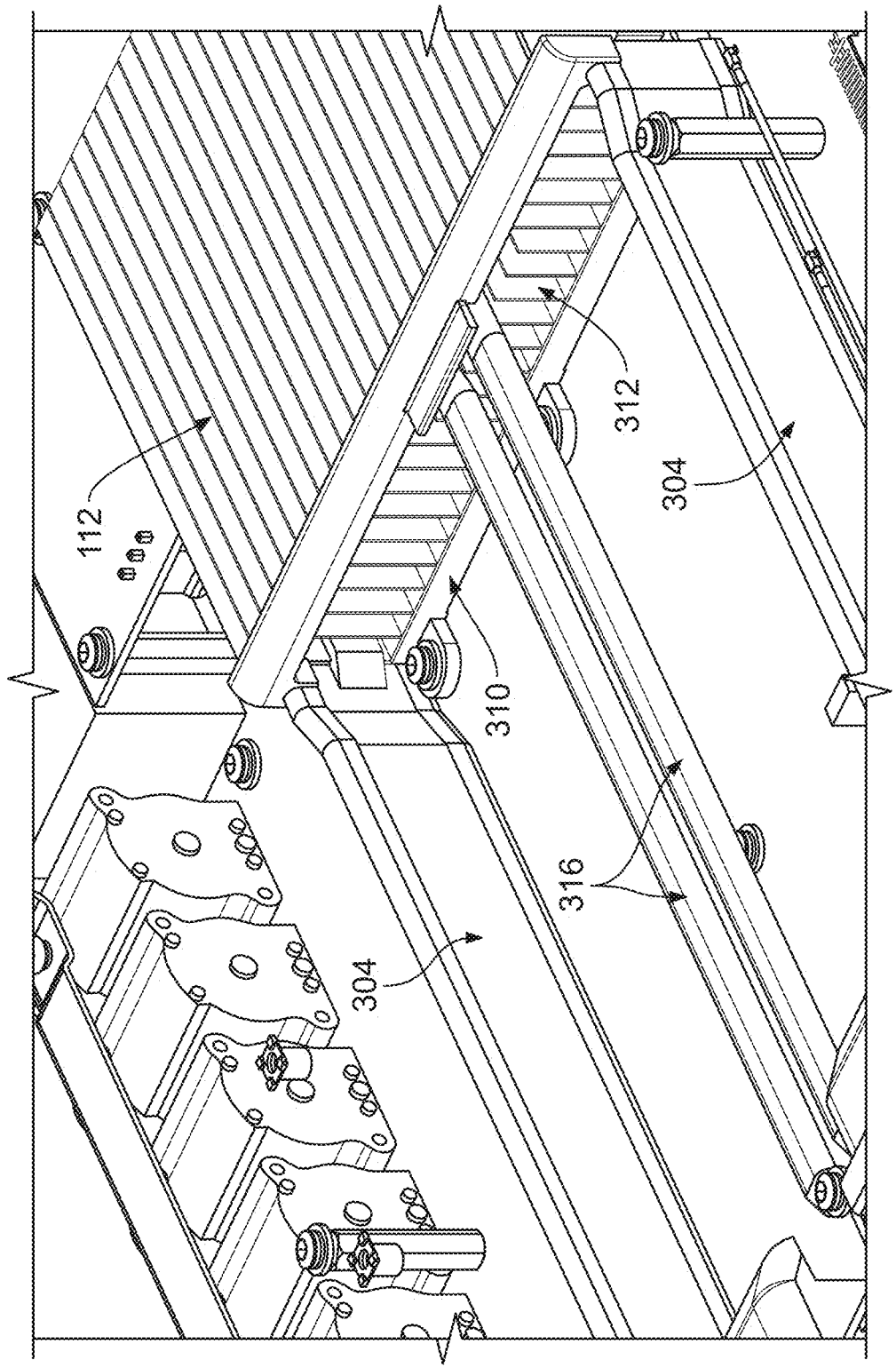
FIG. 3c is a close-up perspective view of the example airflow arrangement of FIG. 3b.

Referring to FIGS. 3b and 3c, heatsink 112 may include, in some examples, a base plate 310 and a plurality of folded stamped fins 312. The spacing of the fins 312 may be optimized to achieve a low pressure drop across the heatsink 112 and may be configured to maintain sufficient heat-transfer of the transceiver housing 100. In some examples, heatsink 112 may include two heat pipes 316 (shown in FIG. 3c) coupled to a carrier interface 314. The carrier interface 314 may be coupled to PCB 104 (shown in FIG. 1). A plurality of thermal interfaces 318 may be disposed intermediate the carrier 314 and PCB 104. Each thermal interface 318 may be configured with a thermal material optimized for heat transfer. In some instances, the heatsink 112, carrier 314, pipes 312, and thermal interfaces 318 may facilitate the heat transfer from PCB 104 to exhaust port 106. For example, heat generated by the power amplifiers (not shown) of PCB 104 may travel into copper coins embedded within the PCB 104. The heat may then be transferred through the thermal interfaces 318 to the carrier 314 and the heat pipes 316. Finally, the heat may be transferred from the carrier 314 and pipes 316 to the plurality of fins 312, where the airflow provided by fans 110 and represented by arrows "F" may provide enhanced dissipation of the heat and force the hot air towards exhaust port 106. In one example, the heatsink 112 may facilitate the heat transfer from an additional PCB disposed beneath PCB 104 (not shown) to exhaust port 106. For example, the additional PCB may be coupled to the base plate 310 of the heatsink 112. The PCB may include thermal interface material similar to that of the thermal interfaces 318. The heat generated by the additional PCB may travel to into said thermal interface material and into the base plate 310. Finally, the heat from the additional PCB may travel into from the base plate 310 to the plurality of fins 312, where the airflow provided by fans 110 and represented by arrows "F" may provide enhanced dissipation of the heat and force the hot air towards exhaust port 106.

In one example, the airflow exiting fans 110 and fan 111 (as shown by arrows "F" and "E", respectively) may be characterized as a laminar flow. That is, the airflow columns represented by arrows F and E may be substantially parallel to one another, may not laterally mix, and may move through the housing 100 and out the sidewall 107 at substantially the same velocities when fans 110 and fan 111 are operating at the same capacity. A laminar flow may decrease the overall system pressure, which may help to mitigate unwanted noise, including humming, whistling, loud vibration, and/or tonal noise, when the fans 110 and fan 111 are running at maximum capacity. A turbulent flow may cause an increase in the system pressure due to the drag resulting from the increase in friction as the air particles collide with one another. Referring again to FIG. 3a, and in one example, the airflow represented by arrows "F1" may provide a Reynolds number of about 4190 at the entrance of the heatsink 112 when fans 110 and fan 111 provide roughly 18.8 m³/hr of flow through the threshold of the heatsink 112. In another example, the airflow entering the heatsink 112 (represented by arrows "F1") may provide a Reynolds number of between about 3620 to about 4420 when fans 110 and fan 111 provide roughly 18.8 m³/hr of flow through the threshold of the heatsink 112. In yet another example, the airflow entering heatsink 112 may provide a Reynolds number of between about 1704 to about 2083 when fans 110 and fan 111 provide roughly 8.5 m³/hr of flow through the threshold of the heatsink 112. In yet another example, the airflow entering the heatsink 112 may provide a Reynolds number of between about 906 and about 1108 when fans 110 and fan 111 provide roughly 4.5 m³/hr of flow through the threshold of the heatsink 112.

In one example, the airflow exiting heat sink 112 (represented by arrows "F2") may provide a Reynolds number of about 3875 when fans 110 and fan 111 provide roughly 17.3 m³/hr of flow through the exit of the heatsink 112. In another example, the airflow exiting heatsink 112 may provide a Reynolds number of between about 3488 and about 4263 when fans 110 and fan 111 provide roughly 17.3 m³/hr of flow through the exit of the heatsink 112. In another example, the airflow exiting heatsink 112 may provide a Reynolds number of between about 1565 and about 1913 when fans 110 and fan 111 provide roughly 7.8 m³/hr of flow through the exit of the heatsink 112. In another example, the airflow exiting heatsink 112 may provide a Reynolds number of between about 837 and about 1023 when fans 110 and fan 111 provide roughly 4.1 m³/hr of flow through the exit of the heatsink 112.

In some examples, when fans 110 and fan 111 provide roughly 8.5 m³/hr of flow through the threshold of the entrance to heatsink 112, the maximum pressure drop (total pressure) across fans 110 and the entrance of heatsink 112 may be about 0.7 Pa; and the maximum pressure drop across the entrance and exit of heatsink 112 may be about 1.0 Pa. In another example, when fans 110 and fan 111 provide roughly 4.5 m³/hr of flow through the threshold of the entrance to heatsink 112, the maximum pressure drop (total pressure) across fans 110 and the entrance of heatsink 112 may be about 0.3 Pa; and the maximum pressure drop across the entrance and exit of heatsink 112 may be about 0.5 Pa.

Alternatively, in some instances the airflow exiting fan 111 (as shown by arrow "E") may be turbulent flow while the air columns represented by arrows "F" may remain laminar flow. The laminar flow of the air columns represented by arrows "F" may be substantially unaffected because duct 302 may substantially shield those air columns from the airflow represented by arrow "E."

Figure 4:
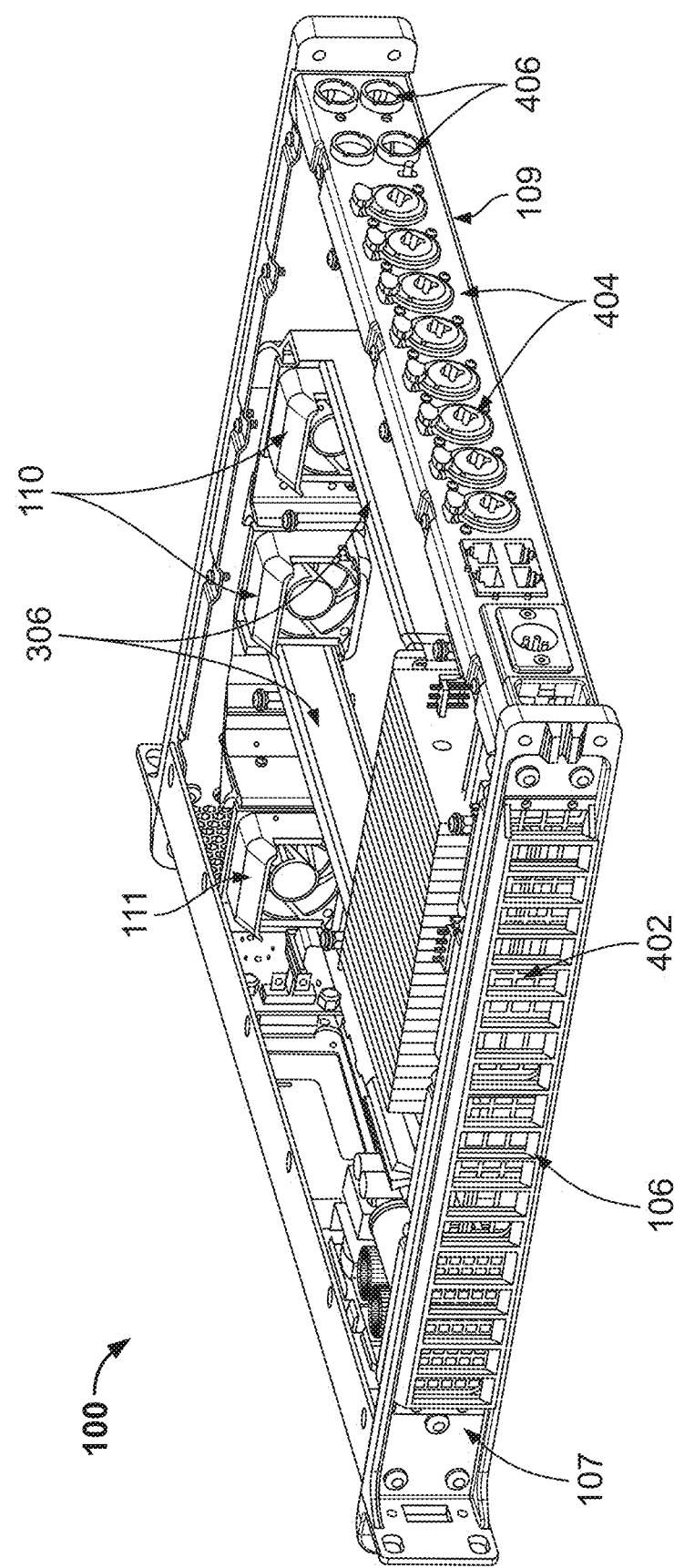
FIG. 4 is a rear perspective view of the example airflow arrangement of FIG. 1.

The sidewall 107 may be perforated or may include at least one aperture with a mesh webbing or metal grate 402 (as shown in FIG. 4) attached thereto to create an exit air path. The air exit path may be configured to balance the airflow from the inlet 102 to sidewall 107 without reducing the overall airflow through the housing 100. In one example, the airflow entering the aperture(s) of sidewall 107 may be characterized as a laminar flow. The sidewall 107 may include an exhaust port 106. The exhaust port 106 may be fixed to sidewall 107 and may extend substantially the entire length of the sidewall 107. The exhaust port 106 may be louvered to direct airflow towards the rear face 109 and away from the air inlet 102 (illustrated by arrows "G"—"J"). The exhaust port 106 is described in greater detail with respect to FIG. 6.

Referring to FIG. 4, the sidewall 107 may be configured to provide an air exit path as described with respect to FIG. 3a. In one example, the sidewall 107 may be perforated metal. In another example, the sidewall 107 may include an aperture over which a metal grate 402 may be attached. The size of the openings on the metal grate 402 may be configured to correspond with the volume of airflow moving through the housing 100. For example, the openings on the metal grate 402 may increase in size from the forward portion of sidewall 107 to the rear portion of sidewall 107. The openings toward the forward portion of sidewall 107 may be smaller than those on the rear portion because less air may be ejected from fan 111 relative to the air being ejected from fans 110. Additionally, the openings on the metal grate 402 toward the forward position of sidewall 107 may be configured to help prevent a user's fingers from crossing the threshold of the apertures of sidewall 107 and contacting the AC/DC converter and/or power supply.

Figure 5A:
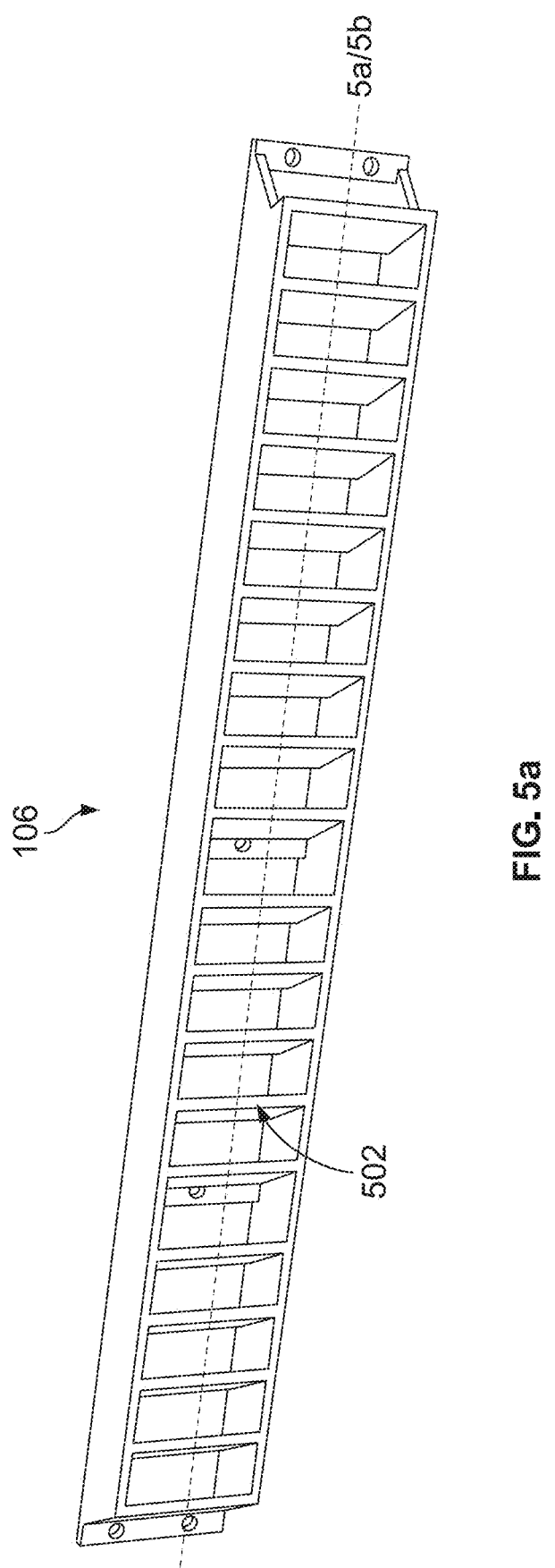
FIG. 5a is a perspective view of an example exhaust port, which can be used in combination with the example airflow arrangement of FIG. 1.

A plurality of connectors 404 may be disposed along the rear face 109 of the wireless audio transceiver housing. The connectors 404 may be configured as external line return (XLR) input connectors which may interface with a variety of audio devices, including vocal microphones, instrument microphones, body pack transmitters, and the like. Additionally, a plurality of antenna connectors 406 may be disposed along the rear face 109 of the wireless audio transceiver housing. The antenna connectors 406 may be configured as coaxial input connectors and may interface with a corresponding plurality of antennas (not shown). In another example, the plurality of antenna connectors and the plurality of antennas may be disposed along the front face 103 and/or along sidewall 105 of the wireless audio transceiver housing FIG. 5a illustrates an example exhaust port 106 isolated from the housing 100. The exhaust port 106 may include a plurality of louvers 502 that are integrally molded to the exhaust port. In one example, the exhaust port 106 may be configured as one continuous array of louvers 502 and may extend substantially the entire length of the grate 402. In another example, the exhaust port 106 may be configured as a discontinuous plurality of arrays of louvers 502 with equal, or unequal, in some instances, lengths attached to the sidewall 107 along the grate 402 at positions that correspond to the positions of fans 110 and fan 111 and/or correspond to the positions of the apertures 602, 604, and 606 (described further below).

Figure 5B:
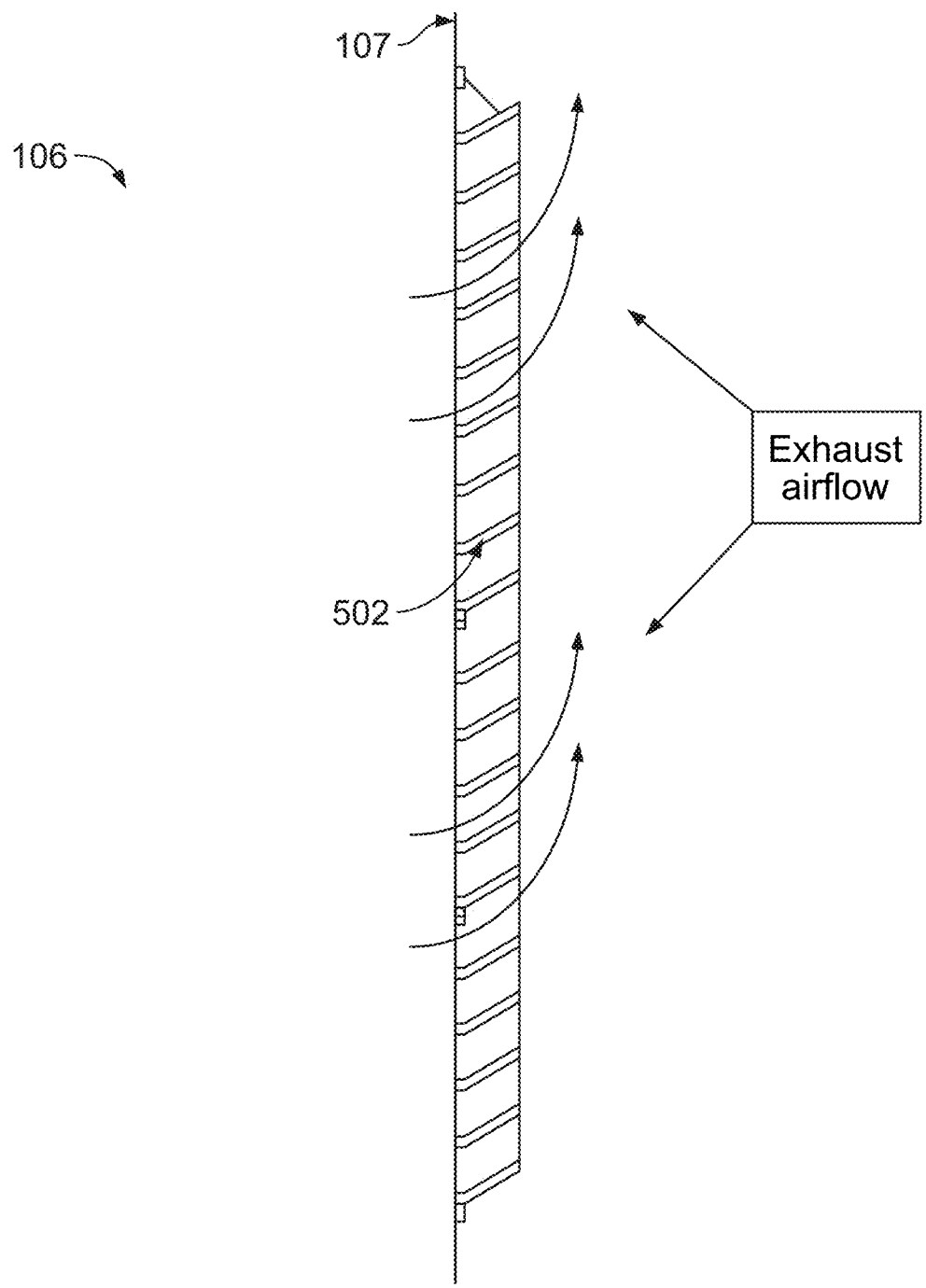

Referring to FIG. 5b, the plurality of louvers 502 may be configured to direct exhaust air towards the rear of the housing 100 to help prevent the exhaust air from re-entering the inlet 102 and may balance the pressure drop for fans 110 and fan 111. For example, the plurality of louvers 502 may be disposed at an angle with respect to the sidewall 107. In one example, the louvers 502 may be disposed at an angle of 46 degrees from the sidewall 107. In another example, the louvers 502 may be disposed at an angle of between 41 degrees and 51 degrees relative to the sidewall 107. In any case, the louver angle may be optimized to increase airflow through the exhaust port 106 and towards the rear of the housing 100 and may be configured to balance the pressure drop for fans 110 and fan 111.

Figure 6:
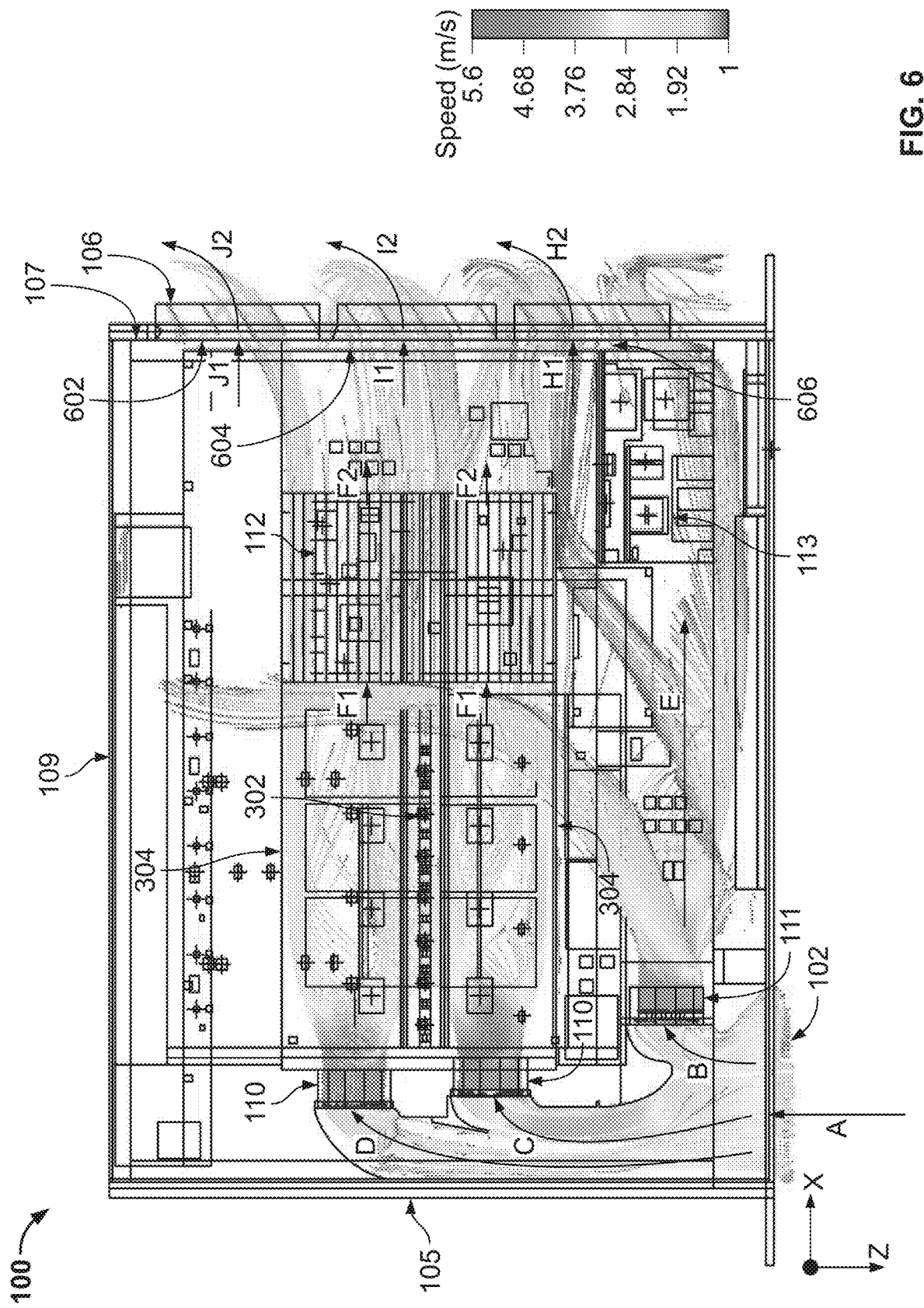
FIG. 6 is a plan view of an example diagram of airflow through the transceiver housing airflow arrangement of FIG. 1.

FIG. 6 illustrates an example diagram of airflow throughout the transceiver housing 100. Arrows "A"-"J" depict the airflow from the air inlet 102, through the housing 100, and out the exhaust port 106. In one example, the intake manifold 108, the fans 110 and fan 111, the inlet vanes 304, and the exhaust port 106 may be configured to function in concert to provide sufficient cooling airflow through the housing 100 and over the internal electronics (e.g., heat sink 112, AC/DC converter 113, and secondary heatsink 306)

while maintaining a low system pressure throughout the housing 100. As mentioned, the geometry of intake manifold 108 may be configured to balance the airflow to fans 111 and fans 110 as well as control the velocity of the air entering fan 111 and fans 110 (represented by arrows "B"—"D," respectively) and the airflow exiting fan 111 and fans 110 (represented by arrows "E" and "F," respectively). Controlling the velocity of airflows A-F may help reduce unwanted noise, including whistling, humming, loud vibrations, and/or tonal noise caused by rapid airflow through the housing 100. In some examples, the velocity of the air entering fan 111 and fans 110 (represented by arrows "B"—"D," respectively) may be maintained at or under 6 meters per second. In some examples, the velocity of the air exiting fan 111 and fans 110 (represented by arrows "E" and "F," respectively) may be maintained at or under 6 meters per second.

The sidewall 107 may include a plurality of apertures and a plurality of exhaust ports 106 that correspond to the plurality of apertures. In one example, sidewall 107 may include three apertures and three corresponding exhaust ports 106. The apertures may extent different lengths along sidewall 107. For example, the aperture 602 may be configured to extend a further length along sidewall 107 than that of the aperture 604, and aperture 604 may configured to extend a further length along sidewall 107 than aperture 606. In this example, aperture 602 may provide a lower impedance to airflow than aperture 604. Aperture 602 may provide a higher impedance to airflow than aperture 604.

In one example, the airflow entering aperture 602 (represented by arrow "J1") may provide a Reynolds number of about 3364 when fans 110 and fan 111 provide roughly 14.8 m$^3$/hr of flow through the threshold of the entrance to aperture 602. In another example, the airflow entering aperture 602 may provide a Reynolds number of between about 3027 and about 3700 when fans 110 and fan 111 provide roughly 14.8 m$^3$/hr of flow through the threshold of the entrance to aperture 602. In another example, the airflow entering aperture 602 may provide a Reynolds number of between about 1437 and about 1757 when fans 110 and fan 111 provide roughly 7.0 m$^3$/hr of flow through the threshold of the entrance to aperture 602. In yet another example, the airflow entering aperture 602 may provide a Reynolds number of between about 820 and about 1002 when fans 110 and fan 111 provide roughly 4.0 m$^3$/hr of flow through the threshold of the entrance to aperture 602.

In one example, the airflow entering aperture 604 (represented by arrow "I1") may provide a Reynolds number of about 3710 when fans 110 and fan 111 provide roughly 9.9 m$^3$/hr of flow through the threshold of the entrance to aperture 604. In another example, the airflow entering aperture 604 may provide a Reynolds number of between about 3340 and about 4080 when fans 110 and fan 111 provide roughly 9.9 m$^3$/hr of flow through the threshold of the entrance to aperture 604. In another example, airflow entering aperture 604 may provide a Reynolds number of between about 1611 and about 1969 when fans 110 and fan 111 provide roughly 4.8 m$^3$/hr of flow through the threshold of the entrance to aperture 604. In yet another example, airflow entering aperture 604 may provide a Reynolds number of between about 914 and about 1117 when fans 110 and fan 111 provide roughly 2.7 m$^3$/hr of flow through the threshold of the entrance to aperture 604.

In one example, the airflow entering aperture 606 (represented by arrow "H1") may provide a Reynolds number of about 3073 when fans 110 and fan 111 provide roughly 8.1 m$^3$/hr of flow through the threshold of the entrance to aperture 606. In another example, the airflow entering aperture 606 may provide a Reynolds number of between about 2676 and about 3380 when fans 110 and fan 111 provide roughly 8.1 m$^3$/hr of flow through the threshold of the entrance to aperture 606. In another example, the airflow entering aperture 606 may provide a Reynolds number of between about 1393 and about 1702 when fans 110 and fan 111 provide roughly 4.1 m$^3$/hr of flow through the threshold of the entrance to aperture 606. In yet another example, the airflow entering aperture 606 may provide a Reynolds number of between about 826 and about 1010 when fans 110 and fan 111 provide roughly 2.4 m$^3$/hr of flow through the threshold of the entrance to aperture 606.

Apertures 602, 604, and 606 may extend the same length along sidewall 107. Sidewall 107 may include fewer than three or more than three apertures and corresponding exhaust ports 106. In some examples, the maximum pressure drop (total pressure) across the exit of heatsink 112 and the threshold of exhaust port 106 may be about 0.6 Pa when fans 110 and fan 111 provide maximum flow rate of air through housing 100.

In some examples, the airflow represented by arrows "B"-"F" may be laminar flow. In some examples, the airflow represented by arrow "E" may be turbulent flow. In another example, the airflow represented by arrow "E" may be a transitional flow between laminar and turbulent flow. In yet another example, the airflow represented by arrows "B"-"D" may be laminar flow and the airflow represented by arrows "E" and "F" may transition from laminar to turbulent flow.

As mentioned with respect to FIG. 5b, the exhaust port 106 may include a plurality of louvers 502. The louvers may be configured to direct exhaust air towards the rear of the housing 100 (represented by arrows "G"—"J"). In some examples, the angle of the louvers 502 with respect to sidewall 107 may be further configured to allow sufficient airflow to exit the exhaust port 107, which may help maintain a low system pressure within the housing 100.

A wireless audio transceiver may comprise a housing. The housing may comprise a front face, a first and second sidewall, a rear face, and at least one air inlet disposed along the front face of the housing. The housing may further comprise an inlet plenum defined by the air inlet, the first sidewall of the housing, and an intake manifold. The intake manifold may comprise at least one inlet duct, wherein the at least one inlet duct may comprise at least one inlet fan disposed within the at least one inlet duct. The housing may comprise at least one inlet vane which may be configured to direct a first airflow from the at least one inlet duct through an interior heatsink to at least one exhaust port attached to the second sidewall of the housing. The intake manifold and the at least one inlet vane may be configured to regulate the velocity of the first airflow to a laminar flow and reduce a resultant noise of the first airflow. The at least one exhaust port may further comprise a plurality of exhaust louvers configured to direct the first airflow from the at least one exhaust port towards the rear face of the housing. The housing may further comprise a first, second and third inlet fan. The intake manifold may be configured to evenly distribute airflow to the first, second, and third inlet fans. The first inlet fan, the second inlet fan, and the third inlet fan may be configured to minimize pressure drop across the first inlet fan, the second inlet fan, and the third inlet fan. The first inlet fan may be attached to the intake manifold adjacent the rear face of the housing. The third inlet fan may be attached to the intake manifold adjacent the air inlet. The second inlet fan may be attached to the intake manifold intermediate the first and third inlet fans. The intake manifold may be further configured such that the first inlet fan is offset from the first sidewall of the housing a first distance, the second inlet fan is offset from the first sidewall of the housing a second distance, and the third inlet fan is offset from the first sidewall a third distance. The first distance may be greater than the second distance and the second distance may be greater than the third distance. The first airflow may be a laminar airflow and the first airflow may provide a Reynolds number of between about 5380 to about 7515. The apparatus may further comprise a second air duct intermediate the inlet plenum and the at least one exhaust port. The air duct may be defined by a first and second inlet vane, a plurality of circuit boards disposed above and below the first and second inlet vanes, and the interior heatsink. The second inlet fan may provide a second airflow that is at least partially parallel to the first airflow. The third inlet fan may provide a third airflow that is at least partially parallel to the first and second airflow. The second and third airflow may be laminar airflow. The second airflow may provide a Reynolds number of between about 5260 to about 7395. The third airflow may provide a Reynolds number of between about 5530 to about 7670. The plurality of louvers of the exhaust port may be fixed at an angle of between 41 and 51 degrees relative to the second sidewall. The intake manifold may be configured to throttle airflow velocity into the first, second, and third inlet fans at no more than seven meters per second. The exhaust port may extend substantially along the entire length of the second sidewall. The housing may further comprise a controller module that is electrically connected to the first, second, and third inlet fan. The controller module may be configured to communicatively enable independent operation of the first, second and third inlet fans. The wireless audio transceiver housing may further comprise a plurality of antennas.

A wireless audio transceiver housing may comprise one or more circuit boards defining one or more generally planar surfaces, a first face comprising at least one ambient air inlet, a first air duct partially defined by the one or more generally planar surfaces of the one or more circuit boards, and a first fan for drawing air from the at least one inlet and the first air duct to provide a first airflow to cool the receiver housing. The first airflow may be a laminar air flow. Both the first air duct and first airflow may provide a Reynolds number of between about 5380 to about 7515. The transceiver housing may further comprise a second air duct providing a second airflow that is at least partially parallel to the first air flow. The second air duct may be at least partially defined by the one or more generally planar surfaces of the circuit board. The second air duct may comprise a second fan for drawing air through the at least one inlet to provide the second airflow to cool the receiver housing. The transceiver housing may further comprise a third air duct providing a third airflow that is at least partially parallel to the first air flow and the second airflow. The third air duct may comprise a third fan for drawing air through the at least one inlet to provide the third airflow to cool the receiver housing. The second airflow and the third airflow may be laminar air flow. The second air duct and second airflow may provide a Reynolds number of between about 5260 to about 7395 and the third air duct and the third airflow may provide a Reynolds number of between about 5530 to about 7670. The first airflow and the second airflow may be laminar air flow and the third airflow may be turbulent. The transceiver housing may further comprise an intake manifold defining a first fan inlet, a second fan inlet, and a third fan inlet. The intake manifold may draw air from the ambient air inlet to supply air to the first fan, the second fan, and the third fan. The intake manifold may be configured to regulate the velocity of the first airflow to a laminar flow and reduce a resultant noise of the first airflow. The first fan inlet, the second fan inlet and the third fan inlet may define curved pathways for each of the first fan, second fan, and the third fan. The first inlet, the second inlet, and the third inlet may be offset from each other. The transceiver housing may further comprise a sidewall. The first inlet may be positioned farther away from the sidewall than the second inlet and the second inlet may be positioned farther away from the sideway than the third inlet. The transceiver housing may further comprise at least one exhaust port. The exhaust port may comprise a plurality of exhaust louvers configured to direct exhaust air from the at least one exhaust port towards a rear face of the transceiver housing. The exhaust port may extend substantially and continuously along the entire length of the second sidewall. The wireless audio transceiver housing may further comprise a plurality of antennas.

A wireless audio transceiver housing may comprise an intake manifold configured to reduce a resultant noise in the housing from a first airflow, regulate the velocity of the first airflow to a laminar flow, and bend the first airflow from an ambient air inlet into a first fan inlet. The intake manifold may further comprise a first curved member configured to operate in concert with a first protruding member to regulate the velocity of the first airflow and to redirect the first airflow approximately 90 degrees from the ambient air inlet into the first fan inlet. The intake manifold may further comprise a second protruding member configured to operate in concert with a second curved member to regulate the velocity of a second airflow and to redirect the second airflow approximately 90 degrees from an ambient air inlet into a second fan inlet; and a third protruding member configured to operate in concert with a third curved member to regulate the velocity of a third airflow and to redirect the third airflow approximately 90 degrees from the ambient air inlet into a third fan inlet. The first, second, and third protruding members, the first, second, and third curved members, and the first, second, and third fan inlets may be configured to operate in concert to evenly distribute the first, second, and third airflows from the ambient air inlet to the respective first, second, and third fan inlets. The intake manifold may be configured to prevent the resultant noise in the housing from the first airflow from exceeding 14 decibels. The intake manifold may be configured to prevent the velocity of the first airflow from exceeding 7 meters per second. The wireless audio transceiver housing may further comprise a plurality of antennas.

In the foregoing specification, the present disclosure has been described with reference to specific exemplary embodiments thereof. Although the disclosure has been described in terms of a preferred embodiment, those skilled in the art will recognize that various modifications, embodiments or variations of the disclosure can be practiced within the spirit and scope of the disclosure as set forth in the appended claims. The specification and drawings are, therefore, to be regarded in an illustrated rather than restrictive sense. Accordingly, it is not intended that the disclosure be limited except as may be necessary in view of the appended claims.

The invention claimed is:
1. A wireless audio transceiver housing comprising:
   an intake manifold configured to:
      reduce a resultant noise in the housing from a first airflow; and
      bend the first airflow from an ambient air inlet into a first fan inlet; and wherein the intake manifold comprises a first protruding member configured to:
regulate a velocity of the first airflow to a laminar flow.

2. The wireless audio transceiver housing of claim 1, wherein the intake manifold comprises a first curved member configured to operate in concert with the first protruding member to regulate the velocity of the first airflow and to redirect the first airflow from a first direction to a second direction from the ambient air inlet into the first fan inlet.

3. The wireless audio transceiver housing of claim 2, wherein the intake manifold further comprises:
 a second protruding member configured to operate in concert with a second curved member to regulate a velocity of a second airflow and to redirect the second airflow from the first direction to the second direction from the ambient air inlet into a second fan inlet; and
 a third protruding member configured to operate in concert with a third curved member to regulate a velocity of a third airflow and to redirect the third airflow from the first direction to the second direction from the ambient air inlet into a third fan inlet.

4. The wireless audio transceiver housing of claim 3, wherein the first, second, and third protruding members; the first, second, and third curved members; and the first, second, and third fan inlets are configured to operate in concert to evenly distribute the first, second, and third airflows from the ambient air inlet to the respective first, second, and third fan inlets.

5. The wireless audio transceiver housing of claim 1, wherein the intake manifold is configured to prevent the resultant noise in the housing from the first airflow from exceeding 14 decibels.

6. The wireless audio transceiver housing of claim 1, further comprising:
 a front face, a first sidewall, a second sidewall, and a rear face, wherein the ambient air inlet is disposed along the front face of the housing;
 an inlet plenum defined by the ambient air inlet, the first sidewall of the housing, and the intake manifold, the intake manifold comprising at least one inlet duct, wherein the at least one inlet duct comprises a first inlet fan, and wherein the first inlet fan is disposed within the at least one inlet duct; and
 at least one inlet vane configured to direct the first airflow from the at least one inlet duct through an interior heatsink to at least one exhaust port attached to the second sidewall of the housing; and
 wherein the first protruding member comprises the at least one inlet vane, and wherein the at least one inlet vane is configured to regulate the velocity of the first airflow to the laminar flow, reduce a resultant noise of the first airflow, and minimize a pressure drop across the inlet duct to the exhaust port.

7. The wireless audio transceiver housing of claim 6, wherein:
 the intake manifold comprises a second inlet duct and a third inlet duct;
 the second inlet duct comprises a second inlet fan within the second inlet duct;
 the third inlet duct comprises a third inlet fan within the third inlet duct;
 the intake manifold is configured to evenly distribute airflow to the first inlet fan, second inlet fan, and third inlet fan; and
 the first inlet fan, the second inlet fan, and the third inlet fan are configured to minimize a pressure drop across the first inlet fan, the second inlet fan, and the third inlet fan.

8. The wireless audio transceiver housing of claim 7 wherein;
 the first inlet fan is attached to the intake manifold adjacent the ambient air inlet;
 the third inlet fan is attached to the intake manifold adjacent the rear face of the housing; and
 the second inlet fan is attached to the intake manifold intermediate the first and third inlet fans.

9. The wireless audio transceiver housing of claim 8, wherein the intake manifold is further configured such that the first inlet fan is offset from the first sidewall of the housing a first distance, the second inlet fan is offset from the first sidewall of the housing a second distance, and the third inlet fan is offset from the first sidewall a third distance.

10. The wireless audio transceiver housing of claim 9, wherein the first distance is greater than the second distance, and the second distance is greater than the third distance.

11. The wireless audio transceiver housing of claim 6, wherein the at least one exhaust port further comprises a plurality of exhaust louvers configured to direct the first airflow from the at least one exhaust port towards the rear face of the housing.

12. The wireless audio transceiver housing of claim 6, further comprising a second air duct intermediate the inlet plenum and the at least one exhaust port, the second air duct defined by a first and second inlet vane, a plurality of circuit boards disposed above and below the first and second inlet vanes, and the interior heatsink.

13. The wireless audio transceiver housing of claim 7, wherein the second inlet fan is configured to provide a second airflow that is at least partially parallel to the first airflow, wherein the third inlet fan is configured to provide a third airflow that is at least partially parallel to the first and second airflow, and wherein the second airflow and the third airflow are laminar air flow.

14. The wireless audio transceiver housing of claim 7, further comprising a controller module that is electrically connected to the first inlet fan, the second inlet fan, and the third inlet fan, wherein the controller module is configured to communicatively enable independent operation of the first inlet fan, the second inlet fan and the third inlet fan.

15. The wireless audio transceiver housing of claim 1, further comprising:
 one or more circuit boards comprising one or more generally planar surfaces;
 a first face comprising the ambient air inlet,
 a first air duct partially defined by the one or more generally planar surfaces of the one or more circuit boards; and
 a first fan for drawing air from the ambient air inlet to the first air duct to provide the first airflow, wherein the first airflow is configured to cool the transceiver housing.

16. The wireless audio transceiver housing of claim 15, further comprising a second air duct providing a second airflow that is at least partially parallel to the first airflow, wherein the second air duct is at least partially defined by the one or more generally planar surfaces of the circuit boards, and wherein the second air duct comprises a second fan for drawing air through the ambient air inlet to provide the second airflow, wherein the second airflow is configured to cool the transceiver housing.

17. The wireless audio transceiver housing of claim 16, further comprising a third air duct configured to provide a third airflow that is at least partially parallel to the first airflow and the second airflow, and wherein the third air duct comprises a third configured to draw air through the ambient air inlet to provide the third airflow, wherein the third airflow is configured to cool the transceiver housing.

18. The wireless audio transceiver housing of claim 17, further comprising an intake manifold defining a first fan inlet, a second fan inlet, and a third fan inlet, and wherein:
the intake manifold is configured to draw air from the ambient air inlet to supply air to the first fan, the second fan, and the third fan; and
the intake manifold is configured to regulate the velocity of the first airflow, the second airflow, and the third airflow to the laminar flow and reduce a resultant noise of the first airflow, second airflow, and the third airflow.

19. The wireless audio transceiver housing of claim 18, further comprising a first sidewall and a second sidewall, and wherein:
the first fan inlet is positioned farther away from the first sidewall than the second inlet, and
the second fan inlet is positioned farther away from the first sidewall than the third inlet.

20. The wireless audio transceiver housing of claim 19, further comprising at least one exhaust port attached to the second sidewall and comprising a plurality of exhaust louvers configured to direct exhaust air from the at least one exhaust port towards a rear face of the transceiver housing.

21. A method by a wireless audio transceiver housing, wherein the method comprises:
reducing, by an intake manifold of the housing, a resultant noise in the housing from a first airflow;
bending, by the intake manifold, the first airflow from an ambient air inlet into a first fan inlet; and
regulating, by a first protruding member of the intake manifold, a velocity of the first airflow to a laminar flow.

* * * * *